United States Patent
Felix et al.

(10) Patent No.: US 9,484,115 B1
(45) Date of Patent: Nov. 1, 2016

(54) POWER SAVINGS VIA SELECTION OF SRAM POWER SOURCE

(71) Applicant: NVIDIA CORPORATION, Santa Clara, CA (US)

(72) Inventors: Stephen Felix, Bristol (GB); Hwong-Kwo Lin, Palo Alto, CA (US); Spencer Gold, Pepperell, MA (US); Jing Guo, Shanghai (CN); Andreas Gotterba, Santa Clara, CA (US); Jason Golbus, Palo Alto, CA (US); Karthik Natarajan, San Jose, CA (US); Jun Yang, Shanghai (CN); Zhenye Jiang, San Jose, CA (US); Ge Yang, Dublin, CA (US); Lei Wang, San Jose, CA (US); Yong Li, Shanghai (CN); Hua Chen, Shanghai (CN); Haiyan Gong, San Jose, CA (US); Beibei Ren, Fremont, CA (US); Eric Voelkel, Ben Lomond, CA (US)

(73) Assignee: NVIDIA Corporation, Santa Clara, CA (US)

( * ) Notice: Subject to any disclaimer, the term of this patent is extended or adjusted under 35 U.S.C. 154(b) by 0 days.

(21) Appl. No.: 14/711,712

(22) Filed: May 13, 2015

(51) Int. Cl.
*G11C 29/08* (2006.01)
*G11C 11/16* (2006.01)
*G11C 7/00* (2006.01)
*G11C 5/14* (2006.01)

(52) U.S. Cl.
CPC ............. *G11C 29/08* (2013.01); *G11C 5/143* (2013.01); *G11C 7/00* (2013.01); *G11C 11/1697* (2013.01)

(58) Field of Classification Search
CPC ...... G11C 29/08; G11C 7/00; G11C 11/1697
See application file for complete search history.

(56) References Cited

U.S. PATENT DOCUMENTS

| | | | |
|---|---|---|---|
| 2010/0238745 A1* | 9/2010 | Campbell | G11C 5/143 365/189.11 |
| 2014/0211572 A1* | 7/2014 | Bartling | G11C 29/08 365/189.08 |
| 2015/0234452 A1* | 8/2015 | Heo | G06F 1/3296 713/320 |
| 2015/0340073 A1* | 11/2015 | Seo | G11O 5/14 365/189.09 |

* cited by examiner

*Primary Examiner* — Richard Elms
*Assistant Examiner* — Ajay Ojha
(74) *Attorney, Agent, or Firm* — Artegis Law Group, LLP

(57) ABSTRACT

A subsystem configured to select the power supply to a static random access memory cell compares the level of a dedicated memory supply voltage to the primary system supply voltage. The subsystem then switches the primary system supply to the SRAM cell when the system voltage is higher than the memory supply voltage with some margin. When the system voltage is lower than the memory supply voltage, with margin, the subsystem switches the memory supply to the SRAM cell. When the system voltage is comparable to the memory supply, the subsystem switches the system voltage to the SRAM cell if performance is a prioritized consideration, but switches the memory supply to the SRAM cell if power reduction is a prioritized consideration. In this manner, the system achieves optimum performance without incurring steady state power losses and avoids timing issues in accessing memory.

20 Claims, 5 Drawing Sheets

US 9,484,115 B1

POWER SAVINGS VIA SELECTION OF SRAM POWER SOURCE

BACKGROUND OF THE INVENTION

Field of the Invention

Embodiments of the present invention relate generally to memory architecture and, more specifically, to power savings via selection of an SRAM power source.

Description of the Related Art

In computer systems, generally, and in graphics processing units (GPUs), in particular, power consumption is a critical parameter. As computing technology migrates to mobile and handheld applications, the benefit of further reduction of power consumption becomes increasingly important. One technique for reducing power consumption is to reduce the overall system voltage. However, many computer systems include SRAM cells, which require some minimum voltage in order to accurately retain the state of stored data. This minimum voltage imposes a lower bound on the system voltage.

This limiting scenario may be overcome by establishing separate power domains for the system voltage and the SRAM circuits. SRAM circuits are then maintained at a higher voltage, and the processors and logic circuitry may operate with a lower voltage. With this approach, the difference between the level of the system voltage domain and that of the SRAM voltage domain must be equalized. Typically, level shifting circuits are utilized to allow the processors and logic to access the SRAM cells across the discontinuous voltage boundary.

One drawback to the above approach is that the level shifting circuits must be powered by the higher SRAM voltage, thus consuming more power than comparable logic domain circuits. The level shifting circuits add significantly to the chip area required due to the large number of interfaces between logic and SRAM. Further, unless the two voltage domains track closely, timing issues arise. If the logic voltage is raised to improve performance and rises above the SRAM voltage, the read noise margin may be reduced, and the SRAM can suffer read disturbances. Conversely, if the logic voltage is lowered below the SRAM voltage to reduce power consumption, timing delays may make writing to the SRAM cell more difficult. As a result, timing issues can limit the maximum level of the logic supply voltage, which limits optimum performance. Further, the minimum voltage that supports SRAM interface and write integrity imposes a lower bound that limits optimum power reduction.

As the foregoing illustrates, what is needed in the art is an effective technique for reducing power usage associated with SRAM cells.

SUMMARY OF THE INVENTION

One embodiment of the present invention sets forth a computer-implemented method for supplying power to a memory module, including determining that a first circuit element within the memory module operates at a first voltage level, determining that a second circuit element within the memory module operates at a nominal voltage level, determining that the first voltage level exceeds the nominal voltage level by a first margin, where the first margin reflects an upper bound to noise associated with the nominal voltage level, and causing the second circuit element to operate at the first voltage level.

One advantage of the disclosed approach is that selecting the SRAM supply voltage based on the level of the system logic voltage and SRAM access requirements affords reduced power, thus supporting the trend to low voltage memory cells in the present technology. Further, with minimal increase in chip area, the disclosed approach affords valid data retention while avoiding timing mismatch issues.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments.

DETAILED DESCRIPTION

In the following description, numerous specific details are set forth to provide a more thorough understanding of the present invention. However, it will be apparent to one of skill in the art that the present invention may be practiced without one or more of these specific details.

System Overview

Figure 1:
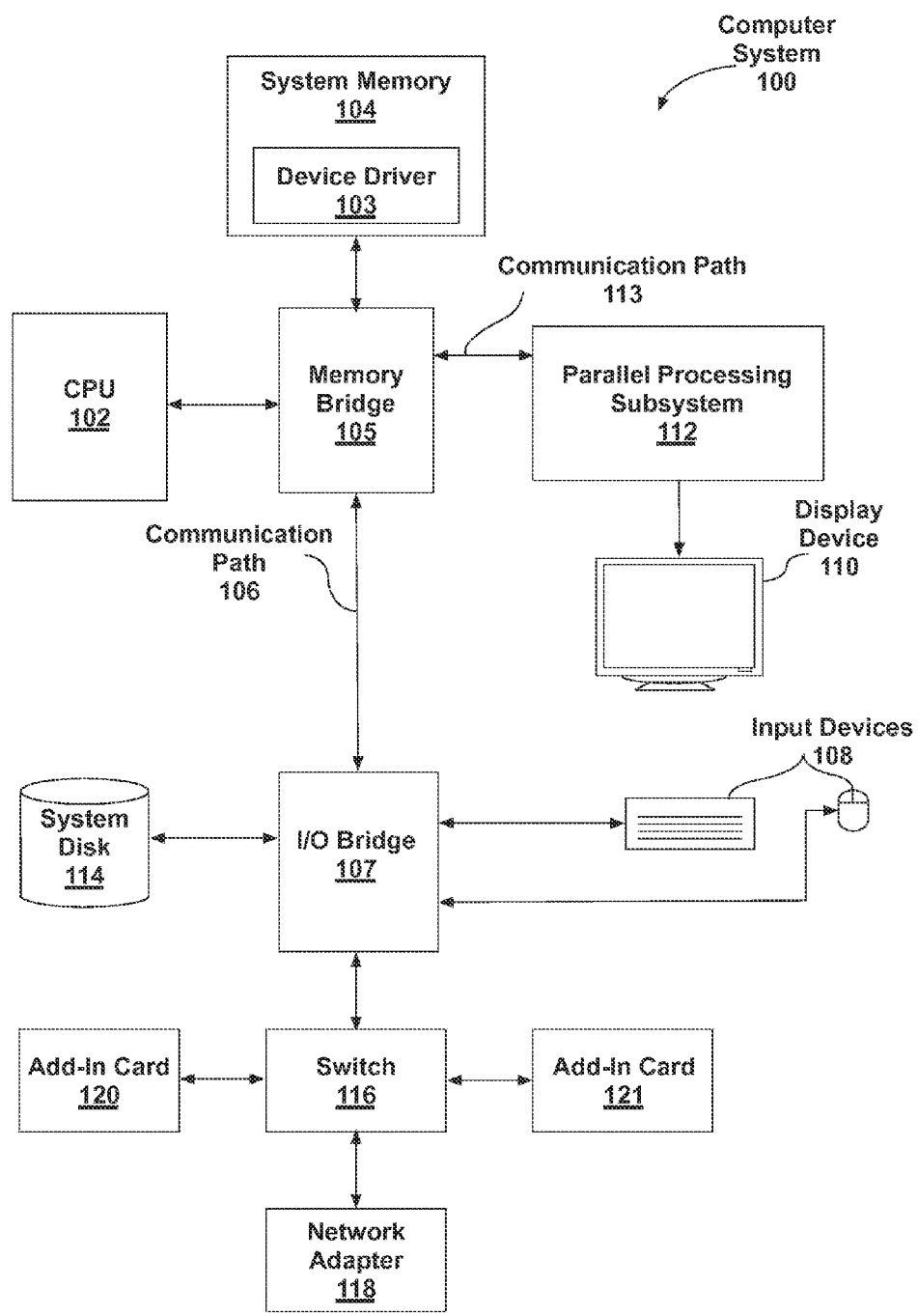
FIG. 1 is a block diagram illustrating a computer system configured to implement one or more aspects of the present invention.

FIG. 1 is a block diagram illustrating a computer system 100 configured to implement one or more aspects of the present invention. As shown, computer system 100 includes, without limitation, a central processing unit (CPU) 102 and a system memory 104 coupled to a parallel processing subsystem 112 via a memory bridge 105 and a communication path 113. Memory bridge 105 is further coupled to an I/O (input/output) bridge 107 via a communication path 106, and I/O bridge 107 is, in turn, coupled to a switch 116.

In operation, I/O bridge 107 is configured to receive user input information from input devices 108, such as a keyboard or a mouse, and forward the input information to CPU 102 for processing via communication path 106 and memory bridge 105. Switch 116 is configured to provide connections between I/O bridge 107 and other components of the computer system 100, such as a network adapter 118 and various add-in cards 120 and 121.

As also shown, I/O bridge 107 is coupled to a system disk 114 that may be configured to store content and applications and data for use by CPU 102 and parallel processing subsystem 112. As a general matter, system disk 114 provides non-volatile storage for applications and data and may include fixed or removable hard disk drives, flash memory devices, and CD-ROM (compact disc read-only-memory), DVD-ROM (digital versatile disc-ROM), Blu-ray, HD-DVD (high definition DVD), or other magnetic, optical, or solid state storage devices. Finally, although not explicitly shown, other components, such as universal serial bus or other port connections, compact disc drives, digital versatile disc drives, film recording devices, and the like, may be connected to I/O bridge 107 as well.

In various embodiments, memory bridge 105 may be a Northbridge chip, and I/O bridge 107 may be a Southbridge chip. In addition, communication paths 106 and 113, as well as other communication paths within computer system 100, may be implemented using any technically suitable protocols, including, without limitation, AGP (Accelerated Graphics Port), HyperTransport, or any other bus or point-to-point communication protocol known in the art.

In some embodiments, parallel processing subsystem 112 comprises a graphics subsystem that delivers pixels to a display device 110 that may be any conventional cathode ray tube, liquid crystal display, light-emitting diode display, or the like. In such embodiments, the parallel processing subsystem 112 incorporates circuitry optimized for graphics and video processing, including, for example, video output circuitry. As described in greater detail below in FIG. 2, such circuitry may be incorporated across one or more parallel processing units (PPUs) included within parallel processing subsystem 112. In other embodiments, the parallel processing subsystem 112 incorporates circuitry optimized for general purpose and/or compute processing. Again, such circuitry may be incorporated across one or more PPUs included within parallel processing subsystem 112 that are configured to perform such general purpose and/or compute operations. In yet other embodiments, the one or more PPUs included within parallel processing subsystem 112 may be configured to perform graphics processing, general purpose processing, and compute processing operations. System memory 104 includes at least one device driver 103 configured to manage the processing operations of the one or more PPUs within parallel processing subsystem 112.

In various embodiments, parallel processing subsystem 112 may be integrated with one or more of the other elements of FIG. 1 to form a single system. For example, parallel processing subsystem 112 may be integrated with CPU 102 and other connection circuitry on a single chip to form a system on chip (SoC).

It will be appreciated that the system shown herein is illustrative and that variations and modifications are possible. The connection topology, including the number and arrangement of bridges, the number of CPUs 102, and the number of parallel processing subsystems 112, may be modified as desired. For example, in some embodiments, system memory 104 could be connected to CPU 102 directly rather than through memory bridge 105, and other devices would communicate with system memory 104 via memory bridge 105 and CPU 102. In other alternative topologies, parallel processing subsystem 112 may be connected to I/O bridge 107 or directly to CPU 102, rather than to memory bridge 105. In still other embodiments, I/O bridge 107 and memory bridge 105 may be integrated into a single chip instead of existing as one or more discrete devices. Lastly, in certain embodiments, one or more components shown in FIG. 1 may not be present. For example, switch 116 could be eliminated, and network adapter 118 and add-in cards 120, 121 would connect directly to I/O bridge 107.

Figure 2:
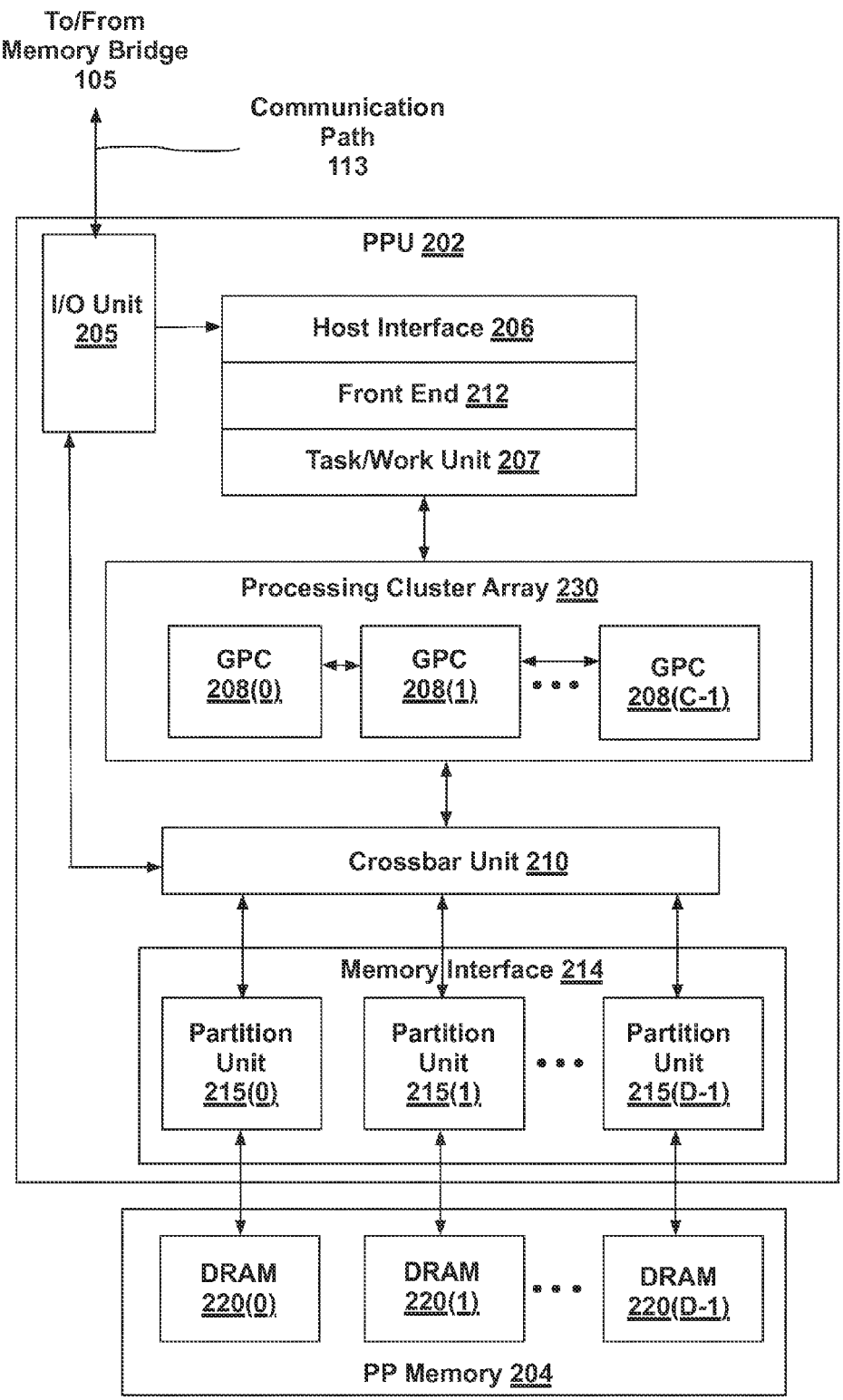
FIG. 2 is a block diagram of a parallel processing unit included in the parallel processing subsystem of FIG. 1, according to one embodiment of the present invention.

FIG. 2 is a block diagram of a parallel processing unit (PPU) 202 included in the parallel processing subsystem 112 of FIG. 1, according to one embodiment of the present invention. Although FIG. 2 depicts one PPU 202, as indicated above, parallel processing subsystem 112 may include any number of PPUs 202. As shown, PPU 202 is coupled to a local parallel processing (PP) memory 204. PPU 202 and PP memory 204 may be implemented using one or more integrated circuit devices, such as programmable processors, application specific integrated circuits (ASICs), or memory devices, or in any other technically feasible fashion.

In some embodiments, PPU 202 comprises a graphics processing unit (GPU) that may be configured to implement a graphics rendering pipeline to perform various operations related to generating pixel data based on graphics data supplied by CPU 102 and/or system memory 104. When processing graphics data, PP memory 204 can be used as graphics memory that stores one or more conventional frame buffers and, if needed, one or more other render targets as well. Among other things, PP memory 204 may be used to store and update pixel data and deliver final pixel data or display frames to display device 110 for display. In some embodiments, PPU 202 also may be configured for general-purpose processing and compute operations.

In operation, CPU 102 is the master processor of computer system 100, controlling and coordinating operations of other system components. In particular, CPU 102 issues commands that control the operation of PPU 202. In some embodiments, CPU 102 writes a stream of commands for PPU 202 to a data structure (not explicitly shown in either FIG. 1 or FIG. 2) that may be located in system memory 104, PP memory 204, or another storage location accessible to both CPU 102 and PPU 202. A pointer to the data structure is written to a pushbuffer to initiate processing of the stream of commands in the data structure. The PPU 202 reads command streams from the pushbuffer and then executes commands asynchronously relative to the operation of CPU 102. In embodiments where multiple pushbuffers are generated, execution priorities may be specified for each pushbuffer by an application program via device driver 103 to control scheduling of the different pushbuffers.

As also shown, PPU 202 includes an I/O (input/output) unit 205 that communicates with the rest of computer system 100 via the communication path 113 and memory bridge 105. I/O unit 205 generates packets (or other signals) for transmission on communication path 113 and also receives all incoming packets (or other signals) from communication path 113, directing the incoming packets to appropriate components of PPU 202. For example, commands related to processing tasks may be directed to a host interface 206, while commands related to memory operations (e.g., reading from or writing to PP memory 204) may be directed to a crossbar unit 210. Host interface 206 reads each pushbuffer and transmits the command stream stored in the pushbuffer to a front end 212.

As mentioned above in conjunction with FIG. 1, the connection of PPU 202 to the rest of computer system 100 may be varied. In some embodiments, parallel processing subsystem 112, which includes at least one PPU 202, is implemented as an add-in card that can be inserted into an expansion slot of computer system 100. In other embodiments, PPU 202 can be integrated on a single chip with a bus bridge, such as memory bridge 105 or I/O bridge 107. Again, in still other embodiments, some or all of the elements of PPU 202 may be included along with CPU 102 in a single integrated circuit or system on chip (SoC).

In operation, front end 212 transmits processing tasks received from host interface 206 to a work distribution unit (not shown) within task/work unit 207. The work distribution unit receives pointers to processing tasks that are encoded as task metadata (TMD) and stored in memory. The pointers to TMDs are included in a command stream that is stored as a pushbuffer and received by the front end unit 212 from the host interface 206. Processing tasks that may be encoded as TMDs include indices associated with the data to be processed as well as state parameters and commands that define how the data is to be processed. For example, the state parameters and commands could define the program to be executed on the data. The task/work unit 207 receives tasks from the front end 212 and ensures that GPCs 208 are configured to a valid state before the processing task specified by each one of the TMDs is initiated. A priority may be specified for each TMD that is used to schedule the execution of the processing task. Processing tasks also may be received from the processing cluster array 230. Optionally, the TMD may include a parameter that controls whether the TMD is added to the head or the tail of a list of processing tasks (or to a list of pointers to the processing tasks), thereby providing another level of control over execution priority.

PPU 202 advantageously implements a highly parallel processing architecture based on a processing cluster array 230 that includes a set of C general processing clusters (GPCs) 208, where C≥1. Each GPC 208 is capable of executing a large number (e.g., hundreds or thousands) of threads concurrently, where each thread is an instance of a program. In various applications, different GPCs 208 may be allocated for processing different types of programs or for performing different types of computations. The allocation of GPCs 208 may vary depending on the workload arising for each type of program or computation.

Memory interface 214 includes a set of D of partition units 215, where D≥1. Each partition unit 215 is coupled to one or more dynamic random access memories (DRAMs) 220 residing within PPM memory 204. In one embodiment, the number of partition units 215 equals the number of DRAMs 220, and each partition unit 215 is coupled to a different DRAM 220. In other embodiments, the number of partition units 215 may be different than the number of DRAMs 220. Persons of ordinary skill in the art will appreciate that a DRAM 220 may be replaced with any other technically suitable storage device. In operation, various render targets, such as texture maps and frame buffers, may be stored across DRAMs 220, allowing partition units 215 to write portions of each render target in parallel to efficiently use the available bandwidth of PP memory 204.

A given GPC 208 may process data to be written to any of the DRAMs 220 within PP memory 204. Crossbar unit 210 is configured to route the output of each GPC 208 to the input of any partition unit 215 or to any other GPC 208 for further processing. GPCs 208 communicate with memory interface 214 via crossbar unit 210 to read from or write to various DRAMs 220. In one embodiment, crossbar unit 210 has a connection to I/O unit 205, in addition to a connection to PP memory 204 via memory interface 214, thereby enabling the processing cores within the different GPCs 208 to communicate with system memory 104 or other memory not local to PPU 202. In the embodiment of FIG. 2, crossbar unit 210 is directly connected with I/O unit 205. In various embodiments, crossbar unit 210 may use virtual channels to separate traffic streams between the GPCs 208 and partition units 215.

Again, GPCs 208 can be programmed to execute processing tasks relating to a wide variety of applications, including, without limitation, linear and nonlinear data transforms, filtering of video and/or audio data, modeling operations (e.g., applying laws of physics to determine position, velocity and other attributes of objects), image rendering operations (e.g., tessellation shader, vertex shader, geometry shader, and/or pixel/fragment shader programs), general compute operations, etc. In operation, PPU 202 is configured to transfer data from system memory 104 and/or PP memory 204 to one or more on-chip memory units, process the data, and write result data back to system memory 104 and/or PP memory 204. The result data may then be accessed by other system components, including CPU 102, another PPU 202 within parallel processing subsystem 112, or another parallel processing subsystem 112 within computer system 100.

As noted above, any number of PPUs 202 may be included in a parallel processing subsystem 112. For example, multiple PPUs 202 may be provided on a single add-in card, or multiple add-in cards may be connected to communication path 113, or one or more of PPUs 202 may be integrated into a bridge chip. PPUs 202 in a multi-PPU system may be identical to or different from one another. For example, different PPUs 202 might have different numbers of processing cores and/or different amounts of PP memory 204. In implementations where multiple PPUs 202 are present, those PPUs may be operated in parallel to process data at a higher throughput than is possible with a single PPU 202. Systems incorporating one or more PPUs 202 may be implemented in a variety of configurations and form factors, including, without limitation, desktops, laptops, handheld personal computers or other handheld devices, servers, workstations, game consoles, embedded systems, and the like.

Figure 3:
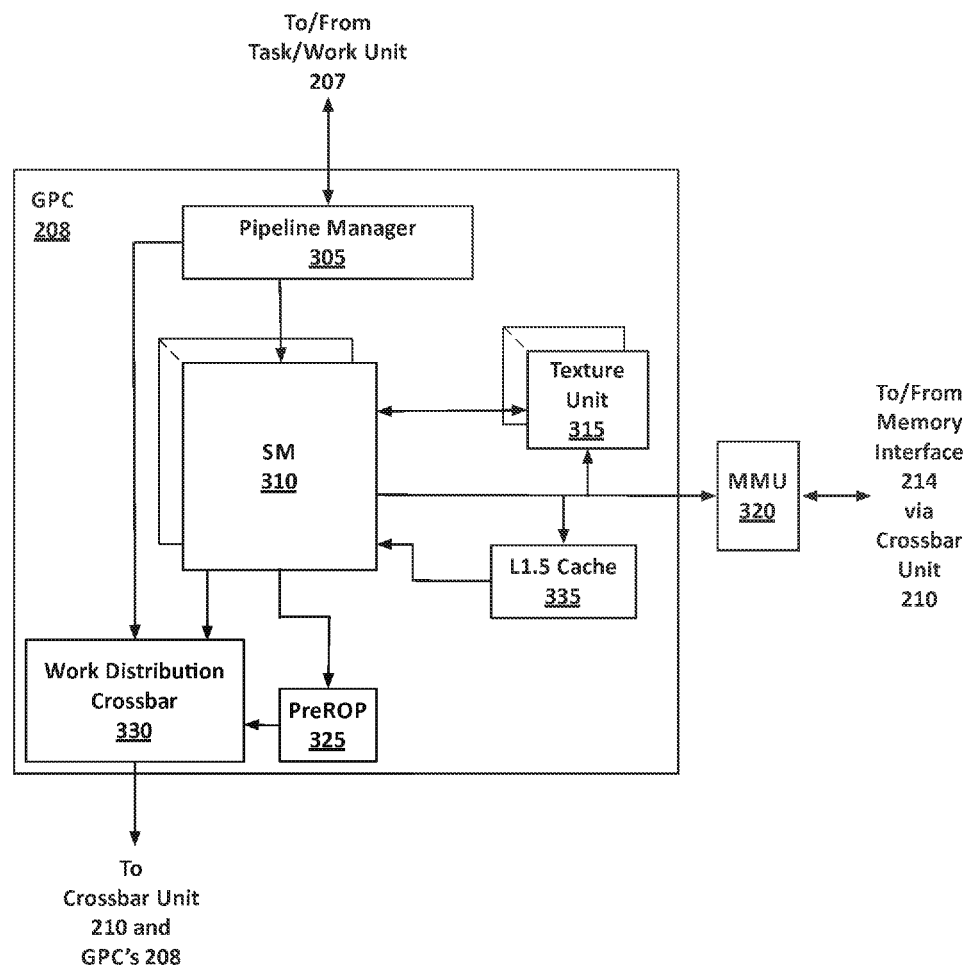
FIG. 3 is a block diagram of a general processing cluster included in the parallel processing unit of FIG. 2, according to one embodiment of the present invention.

FIG. 3 is a block diagram of a GPC 208 included in PPU 202 of FIG. 2, according to one embodiment of the present invention. In operation, GPC 208 may be configured to execute a large number of threads in parallel to perform graphics, general processing and/or compute operations. As used herein, a "thread" refers to an instance of a particular program executing on a particular set of input data. In some embodiments, single-instruction, multiple-data (SIMD) instruction issue techniques are used to support parallel execution of a large number of threads without providing multiple independent instruction units. In other embodiments, single-instruction, multiple-thread (SIMT) techniques are used to support parallel execution of a large number of generally synchronized threads, using a common instruction unit configured to issue instructions to a set of processing engines within GPC 208. Unlike a SIMD execution regime, where all processing engines typically execute identical instructions, SIMT execution allows different threads to more readily follow divergent execution paths through a given program. Persons of ordinary skill in the art will understand that a SIMD processing regime represents a functional subset of a SIMT processing regime.

Operation of GPC 208 is controlled via a pipeline manager 305 that distributes processing tasks received from a work distribution unit (not shown) within task/work unit 207 to one or more streaming multiprocessors (SMs) 310. Pipeline manager 305 may also be configured to control a work distribution crossbar 330 by specifying destinations for processed data output by SMs 310.

In one embodiment, GPC 208 includes a set of M of SMs 310, where M≥1. Also, each SM 310 includes a set of functional execution units (not shown), such as execution units and load-store units. Processing operations specific to any of the functional execution units may be pipelined, which enables a new instruction to be issued for execution before a previous instruction has completed execution. Any combination of functional execution units within a given SM 310 may be provided. In various embodiments, the functional execution units may be configured to support a variety of different operations including integer and floating point arithmetic (e.g., addition and multiplication), comparison operations, Boolean operations (AND, OR, XOR), bit-shifting, and computation of various algebraic functions (e.g., planar interpolation and trigonometric, exponential, and logarithmic functions, etc.). Advantageously, the same functional execution unit can be configured to perform different operations.

In operation, each SM 310 is configured to process one or more thread groups. As used herein, a "thread group" or "warp" refers to a group of threads concurrently executing the same program on different input data, with one thread of the group being assigned to a different execution unit within an SM 310. A thread group may include fewer threads than the number of execution units within the SM 310, in which case some of the execution may be idle during cycles when that thread group is being processed. A thread group may also include more threads than the number of execution units within the SM 310, in which case processing may occur over consecutive clock cycles. Since each SM 310 can support up to G thread groups concurrently, it follows that up to G*M thread groups can be executing in GPC 208 at any given time.

Additionally, a plurality of related thread groups may be active (in different phases of execution) at the same time within an SM 310. This collection of thread groups is referred to herein as a "cooperative thread array" ("CTA") or "thread array." The size of a particular CTA is equal to m*k, where k is the number of concurrently executing threads in a thread group, which is typically an integer multiple of the number of execution units within the SM 310, and m is the number of thread groups simultaneously active within the SM 310.

Although not shown in FIG. 3, each SM 310 contains a level one (L1) cache or uses space in a corresponding L1 cache outside of the SM 310 to support, among other things, load and store operations performed by the execution units. Each SM 310 also has access to level two (L2) caches (not shown) that are shared among all GPCs 208 in PPU 202. The L2 caches may be used to transfer data between threads. Finally, SMs 310 also have access to off-chip "global" memory, which may include PP memory 204 and/or system memory 104. It is to be understood that any memory external to PPU 202 may be used as global memory. Additionally, as shown in FIG. 3, a level one-point-five (L1.5) cache 335 may be included within GPC 208 and configured to receive and hold data requested from memory via memory interface 214 by SM 310. Such data may include, without limitation, instructions, uniform data, and constant data. In embodiments having multiple SMs 310 within GPC 208, the SMs 310 may beneficially share common instructions and data cached in L1.5 cache 335.

Each GPC 208 may have an associated memory management unit (MMU) 320 that is configured to map virtual addresses into physical addresses. In various embodiments, MMU 320 may reside either within GPC 208 or within the memory interface 214. The MMU 320 includes a set of page table entries (PTEs) used to map a virtual address to a physical address of a tile or memory page and optionally a cache line index. The MMU 320 may include address translation lookaside buffers (TLB) or caches that may reside within SMs 310, within one or more L1 caches, or within GPC 208.

In graphics and compute applications, GPC 208 may be configured such that each SM 310 is coupled to a texture unit 315 for performing texture mapping operations, such as determining texture sample positions, reading texture data, and filtering texture data.

In operation, each SM 310 transmits a processed task to work distribution crossbar 330 in order to provide the processed task to another GPC 208 for further processing or to store the processed task in an L2 cache (not shown), parallel processing memory 204, or system memory 104 via crossbar unit 210. In addition, a pre-raster operations (preROP) unit 325 is configured to receive data from SM 310, direct data to one or more raster operations (ROP) units within partition units 215, perform optimizations for color blending, organize pixel color data, and perform address translations.

It will be appreciated that the core architecture described herein is illustrative and that variations and modifications are possible. Among other things, any number of processing units, such as SMs 310, texture units 315, or preROP units 325, may be included within GPC 208. Further, as described above in conjunction with FIG. 2, PPU 202 may include any number of GPCs 208 that are configured to be functionally similar to one another so that execution behavior does not depend on which GPC 208 receives a particular processing task. Further, each GPC 208 operates independently of the other GPCs 208 in PPU 202 to execute tasks for one or more application programs. In view of the foregoing, persons of ordinary skill in the art will appreciate that the architecture described in FIGS. 1-3 in no way limits the scope of the present invention.

Power Savings Via Selection of SRAM Power Source

Figure 4:
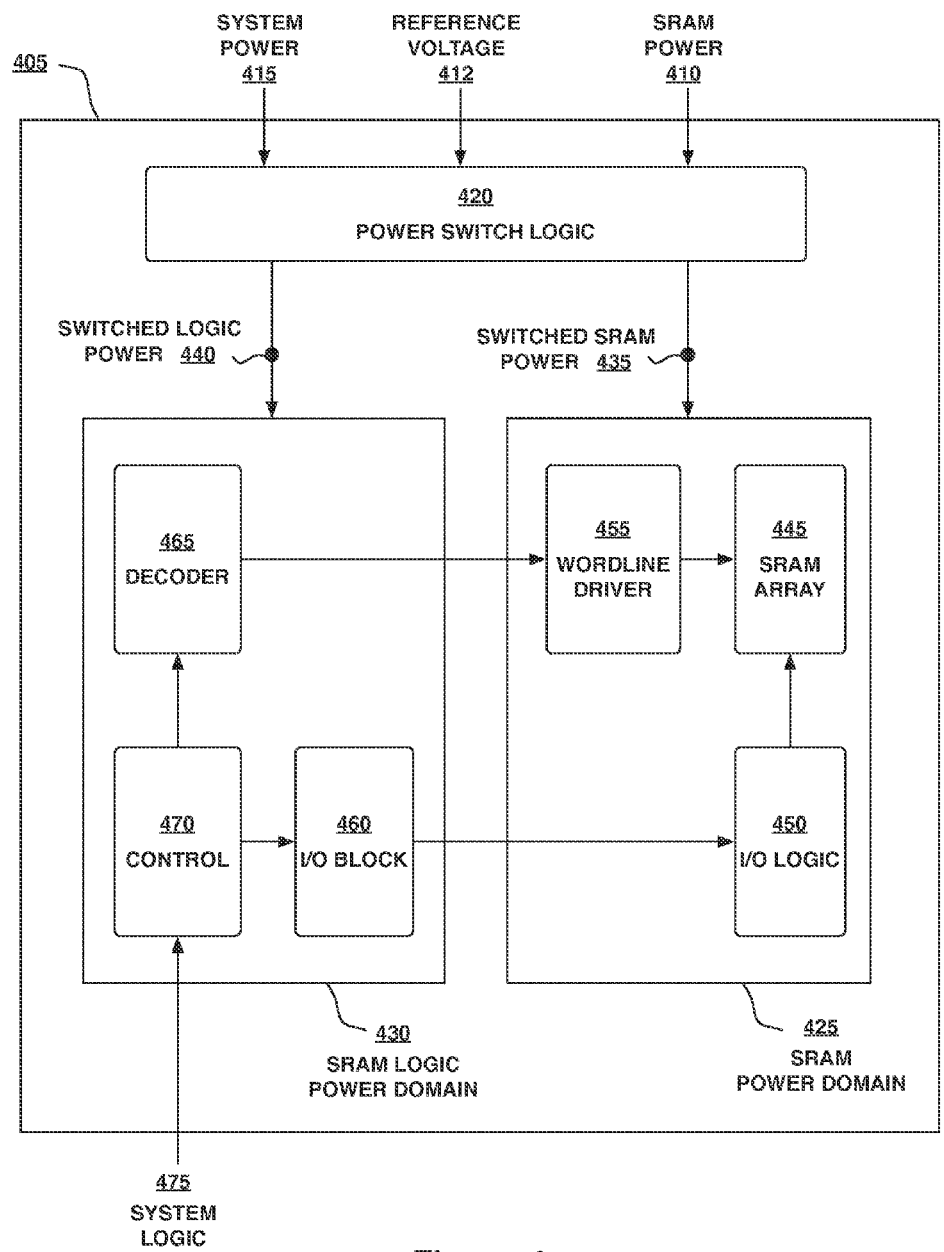
FIG. 4 is a conceptual diagram of a subsystem configured to select a power source for an SRAM memory cell, according to one embodiment of the present invention.

FIG. 4 is a conceptual diagram of a subsystem 405 configured to select a power source for an SRAM memory cell, according to one embodiment of the present invention. In various embodiments, subsystem 405 may be included within any portion of computer system 100 of FIG. 1 and configured to select the power source of one or more relevant SRAM cells. For example, subsystem 405 could be coupled to PP memory 204 and configured to select the power source of SRAM cells within PP memory 204. As another example, subsystem 405 could be coupled to L1.5 cache 335 and configured to select the power source of SRAM cells within L1.5 cache 335. In yet another example, subsystem 405 could be coupled to an SRAM included within a system-on-chip (SoC) and configured to select the power source of that SRAM.

As shown, subsystem 405 includes power switch logic 420, SRAM power domain 425, and SRAM logic power domain 430. SRAM power domain 425 includes SRAM array 445, I/O logic 450, and wordline driver 455. SRAM logic power domain 430 includes I/O block 460, decoder 465, and control 470. Power switch logic 420 receives SRAM power 410 and system power 415 and then connects switched SRAM power 435 to SRAM power domain 425 and connects switched logic power 440 to SRAM logic power domain 430. SRAM power 410 has a voltage level that is greater than or equal to the minimum voltage level needed to support the operation of SRAM power domain 425.

SRAM array 445 is an SRAM memory macro that stores system data. I/O logic 450 is a logic interface that accommodates any potential mismatch between switched SRAM power 435 and switched logic power 440. I/O logic 450 implements a power boundary interface between I/O block 460, powered by switched logic power 440, and SRAM array 445, powered by switched SRAM power 435. Similarly, wordline driver 455 implements a power boundary interface between decoder 465, powered by switched logic power 440, and SRAM array 445, powered by switched SRAM power 435. Control 470 receives instructions from system logic 475 to determine the data and wordline connectivity of I/O block 460 and decoder 465, respectively, to write data to SRAM array 445.

System power 415 represents power associated with a system within which subsystem 405 resides, such as computer system 100. The voltage of system power 415 may vary to support different operating modes of subsystem 405. Higher voltage levels of switched SRAM power 435 and switched logic power 440 support improved performance when high performance is a priority. During such high performance modes of operation, it is advantageous for switched SRAM power 435 to closely track switched logic power 440. When low power operation is a priority, the voltage level of switched logic power 440 may be reduced. Further, the voltage level of switched SRAM power 435 may be reduced to the minimum level that supports reliable data retention.

System power 415 and SRAM power 410 may be the same or different from one another. In particular, one of three scenarios may occur. First, system power 415 may be greater than SRAM power 410. Specifically, system power 415 may be greater than SRAM power 410 plus some margin, typically to improve performance. Second, system power 415 may be less than SRAM power 410, typically to reduce power consumption. Specifically, system power 415 may be less than SRAM power 410 minus some margin. In a special case of the scenario when system power 415 is less than SRAM power 410, system power 415 may be gated off during an idle mode. Third, system power 415 may be comparable to SRAM power 410. Specifically, system power 415 may be less than SRAM power 410 plus some margin, but greater than SRAM power 410 minus some margin, that is, within some margin band of SRAM power 410.

In one embodiment, power switch logic 420 connects system power 415 to switched logic power 440. Power switch logic 420 then determines the level of system power 415 relative to SRAM power 410 according to the three scenarios discussed herein.

When system power 415 is greater than SRAM power 410 plus some margin alpha (i.e., according to the first scenario), power switch logic 420 connects system power 415 to switched SRAM power 435. The value of SRAM power 410 varies in the physical system due to variations in element tolerances, temperature, and aging. The margin, alpha, is the difference between the maximum value of SRAM power 410 and the nominal design value of SRAM power 410.

When system power 415 is less than SRAM power 410 minus some margin beta (i.e., according to the second scenario), power switch logic 420 connects SRAM power 410 to switched SRAM power 435. The margin, beta, is the difference between the nominal design value of SRAM power 410 and the minimum value of SRAM power 410.

When system power 415 is less than SRAM power 410 plus some number alpha but greater than SRAM power 410 minus some number beta (i.e., according to the third scenario), power switch logic 420 selects switched SRAM power 435 based on the priorities of the system. Specifically, if system performance is prioritized, power switch logic 420 connects system power 415 to switched SRAM power 435. Alternatively, if power saving is prioritized, power switch logic 420 connects SRAM power 410 to switched SRAM power 435.

In this manner, the subsystem achieves optimum system performance when system power 415 is higher than the maximum value of SRAM power 410. Further, the subsystem has the facility to select between improved performance and reduced power usage based on system priorities when system power 415 is comparable to SRAM power 410. Finally, the subsystem achieves optimum power reduction when system power 415 is lower than the minimum value of SRAM power 410.

In another embodiment, power switch logic 420 similarly connects system power 415 to switched logic power 440 and power switch logic 420 then determines the level of system power 415 relative to reference voltage 412.

When system power 415 is greater than reference voltage 412, power switch logic 420 connects system power 415 to switched SRAM power 435. When system power 415 is less than reference voltage 412, power switch logic 420 connects SRAM power 410 to switched SRAM power 435.

In this manner, the subsystem achieves optimum system performance when system power 415 is higher than the maximum value of SRAM power 410 and achieves optimum power reduction when system power 415 is lower than the minimum value of SRAM power 410.

Figure 5:
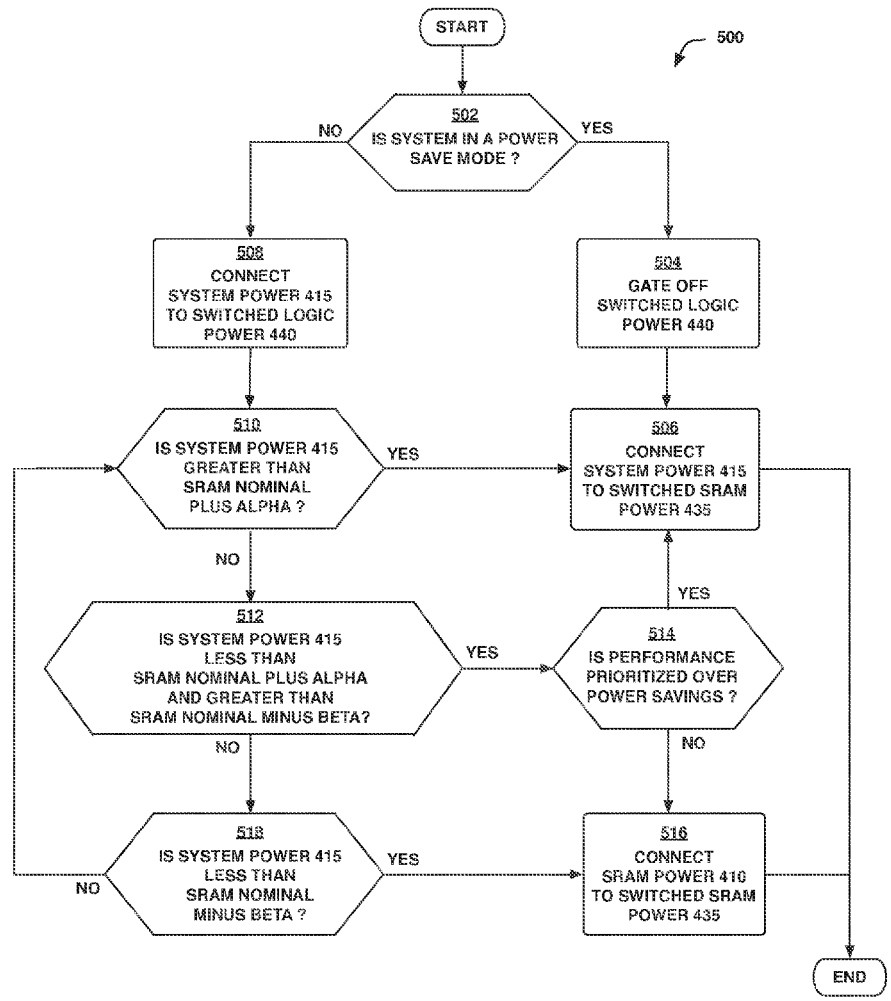
FIG. 5 is a flow diagram of method steps for selecting a power source for an SRAM memory cell, according to one embodiment of the present invention.

FIG. 5 is a flow diagram of method steps for selecting a power source for an SRAM memory cell, according to one embodiment of the present invention. Although the method steps are described in conjunction with the systems of FIGS. 1-4, persons skilled in the art will understand that any system configured to perform the method steps, in any order, is within the scope of the present invention.

As shown, a method 500 begins at step 502, where power switch logic 420 determines if the system is in a power save mode. If, at step 502, power switch logic 420 determines that the system is in a power save mode, then the method 500 proceeds to step 504. At step 504, power switch logic 420 gates off switched logic power 440. At step 506, power switch logic 420 connects SRAM power 410 to switched SRAM power 435, thus completing the power connectivity configuration.

Returning, now, to step 502, if power switch logic 420 determines that the system is not in a power save mode, the method 500 proceeds to step 508. At step 508, power switch logic 420 connects system power 415 to switched logic power 440.

At step 510, power switch logic 420 determines if system power 415 is greater than SRAM nominal plus some margin alpha. SRAM nominal may be equal to SRAM power 410. Alternatively, SRAM nominal may be equal to reference voltage 412, which represents a minimum voltage that supports accurate data retention in the SRAM. If at step 510, power switch logic 420 determines that system power 415 is greater than SRAM nominal, then the method 500 proceeds to step 506. As above, at step 506, power switch logic 420 connects system power 415 to switched SRAM power 435, thus completing the power connectivity configuration. If at step 510, power switch logic 420 determines that system power 415 is not greater than SRAM nominal plus some margin alpha, the method 500 proceeds to step 512.

At step 512, power switch logic 420 determines if system power 415 is less than SRAM nominal plus some margin alpha and greater than SRAM nominal minus some margin beta. If at step 512, power switch logic 420 determines that system power 415 is greater than SRAM nominal plus some margin alpha and less than SRAM nominal minus some margin beta, then the method 500 proceeds to step 514.

At step 514, power switch logic 420 determines if system performance is prioritized over power savings. If, at step 514, power switch logic 420 determines that system performance is prioritized over power savings, then the method 500 proceeds to step 506. As above, at step 506, power switch logic 420 connects system power 415 to switched SRAM power 435, thus completing the power connectivity configuration. If, at step 514, power switch 420 determines that power savings is prioritized over system performance, then the method 500 proceeds to step 516. At step 516, power switch logic 420 connects SRAM power 410 to switched SRAM power 435, thus completing the power connectivity configuration.

Returning now, to step 512, if power switch logic 420 determines that system power 415 is not greater than SRAM nominal plus some margin alpha and less than SRAM nominal minus some margin beta, then the method 500 proceeds to step 518.

At step 518, power switch logic 420 determines if system power 415 is less than SRAM nominal minus some margin beta. If at step 518, power switch logic 420 determines that SRAM nominal is not less than SRAM power 410 minus some margin beta, then the method 500 returns to step 510 to re-analyze the difference between SRAM nominal and system power 415. If at step 518, power switch logic 420 determines that system power 415 is less than SRAM nominal minus some margin beta, then the method 500 proceeds to step 516. As above, at step 516, power switch logic 420 connects SRAM power 410 to switched SRAM power 435, thus completing the power connectivity configuration.

Persons skilled in the art will understand that the technique described above for modifying the power supplied to SRAM power domain 425 is implicitly applicable to modifying the voltage supplied to SRAM power domain 425. Specifically, adjusting power in the aforementioned fashion generally results in adjustments to the voltage level supplied to SRAM power domain 425. As such, the method 500 described above allows SRAM array 445 within SRAM power domain 425 to operate with at least the minimum voltage level needed to accurately retain data, as well as to operate with a higher voltage level in the various scenarios described above.

In sum, a subsystem configured to select the power supply for a static random access memory cell compares the level of a dedicated memory supply voltage to the primary system supply voltage. The subsystem then switches the primary system supply to the SRAM cell when the system voltage is higher than the memory supply voltage, with some margin. When the system voltage is lower than the memory supply voltage, with some margin, the subsystem switches the memory supply to the SRAM cell. When the system voltage is comparable to the memory supply, the subsystem switches the system voltage to the SRAM cell if performance is a prioritized consideration, but switches the memory supply to the SRAM cell if power reduction is a prioritized consideration. In this manner, the system achieves optimum performance without incurring steady state power losses and avoids timing issues in accessing the memory.

One advantage of the subsystems disclosed herein is that selecting the supply voltage for the SRAM circuits according to the level of the system voltage allows close matching of the system voltage and the SRAM supply voltage. This configuration obviates the need for level shifters, thereby saving chip area and reducing overhead power usage. Further, the system voltage may be increased for improved performance or decreased for improved power reduction without causing timing issues in SRAM access.

One embodiment of the invention may be implemented as a program product for use with a computer system. The program(s) of the program product define functions of the embodiments (including the methods described herein) and can be contained on a variety of computer-readable storage media. Illustrative computer-readable storage media include, but are not limited to: (i) non-writable storage media (e.g., read-only memory devices within a computer such as compact disc read only memory (CD-ROM) disks readable by a CD-ROM drive, flash memory, read only memory (ROM) chips or any type of solid-state non-volatile semiconductor memory) on which information is permanently stored; and (ii) writable storage media (e.g., floppy disks within a diskette drive or hard-disk drive or any type of solid-state random-access semiconductor memory) on which alterable information is stored.

The invention has been described above with reference to specific embodiments. Persons of ordinary skill in the art, however, will understand that various modifications and changes may be made thereto without departing from the broader spirit and scope of the invention as set forth in the appended claims. The foregoing description and drawings are, accordingly, to be regarded in an illustrative rather than a restrictive sense.

Therefore, the scope of embodiments of the present invention is set forth in the claims that follow.

The invention claimed is:

1. A computer-implemented method for supplying power to a memory module, the method comprising:
   determining that a first circuit element within the memory module operates at a first voltage level;
   determining that a second circuit element within the memory module operates at a nominal voltage level;
   determining that the first voltage level exceeds the nominal voltage level by a first margin, wherein the first margin reflects an upper bound to noise associated with the nominal voltage level; and
   causing the second circuit element to operate at the first voltage level.

2. The computer-implemented method of claim 1, further comprising:
   determining that the first circuit element has begun to operate at a second voltage level instead of operating at the first voltage level;
   determining that the second voltage level is less than the sum of the nominal voltage level and the first margin and greater than the difference of the nominal voltage level and a second margin, wherein the second margin reflects a lower bound to noise associated with the nominal voltage level;
   determining that performance is prioritized over power savings relative to the second circuit element; and
   causing the second circuit element to operate at the second voltage level.

3. The computer-implemented method of claim 1, further comprising:
   determining that the first circuit element has begun to operate at a second voltage level instead of operating at the first voltage level;
   determining that the second voltage level is less than the sum of the nominal voltage level and the first margin and greater than the difference of the nominal voltage level and a second margin, wherein the second margin reflects a lower bound to noise associated with the nominal voltage level;
determining that power savings is prioritized over performance relative to the second circuit element; and
causing the second circuit element to operate with the nominal voltage level.

4. The computer-implemented method of claim 1, further comprising:
determining that the first circuit element has begun to operate at a second voltage level instead of operating at the first voltage level;
determining that the second voltage level is less than the difference of the nominal voltage level and a second margin, wherein the second margin reflects a lower bound to noise associated with the nominal voltage level; and
causing the second circuit element to operate at the nominal voltage level.

5. The computer-implemented method of claim 1, further comprising:
determining that the first circuit element has begun to operate at a second voltage level instead of operating at the first voltage level;
determining that the second voltage level is zero; and
causing the second circuit element to operate at the nominal voltage level.

6. The computer-implemented method of claim 1, wherein the first circuit element comprises logic that is configured to access the second circuit element.

7. The computer-implemented method of claim 1, wherein the second circuit element comprises a static random access memory array.

8. The computer-implemented method of claim 7, wherein the nominal voltage level comprises a minimum voltage level needed to support data retention within the static random access memory array.

9. A subsystem configured to supply power to a memory module, comprising:
a first circuit element within the memory module that operates at a first voltage level;
a second circuit element within the memory module that operates at a nominal voltage level; and
a control circuit configured to:
determine that the first voltage level exceeds the nominal voltage level by a first margin, wherein the first margin reflects an upper bound to noise associated with the nominal voltage level, and
apply the first voltage level to the second circuit element.

10. The subsystem of claim 9, wherein the control element is further configured to:
determine that the first circuit element has begun to operate at a second voltage level instead of operating at the first voltage level;
determine that the second voltage level is less than the sum of the nominal voltage level and the first margin and greater than the difference of the nominal voltage level and a second margin, wherein the second margin reflects a lower bound to noise associated with the nominal voltage level;
determine that performance is prioritized over power savings relative to the second circuit element; and
apply the second voltage level to the second circuit element.

11. The subsystem of claim 9, wherein the control element is further configured to:
determine that the first circuit element has begun to operate at a second voltage level instead of operating at the first voltage level;
determine that the second voltage level is less than the sum of the nominal voltage level and the first margin and greater than the difference of the nominal voltage level and a second margin, wherein the second margin reflects a lower bound to noise associated with the nominal voltage level;
determine that power savings is prioritized over performance relative to the second circuit element; and
apply the nominal voltage level to the second circuit element.

12. The subsystem of claim 9, wherein the control element is further configured to:
determine that first circuit element has begun to operate at a second voltage level instead of operating at the first voltage level;
determine that the second voltage level is less than difference of the nominal voltage level and a second margin, wherein the second margin reflects a lower bound to noise associated with the nominal voltage level; and
apply the nominal voltage level to the second circuit element.

13. The subsystem of claim 9, wherein the control element is further configured to:
determine that first circuit element has begun to operate at a second voltage level instead of operating at the first voltage level;
determine that the second voltage level is zero; and
apply the nominal voltage level to the second circuit element.

14. The subsystem of claim 9, wherein the first circuit element comprises logic that is configured to access the second circuit element.

15. The subsystem of claim 9, wherein the second circuit element comprises a static random access memory array.

16. The subsystem of claim 15, wherein the nominal voltage level comprises a minimum voltage level needed to support data retention within the static random access memory array.

17. A computing device configured to supply power to a memory module, comprising:
a first circuit element within the memory module that operates at a first voltage level;
a second circuit element within the memory module that operates at a nominal voltage level; and
a control circuit configured to:
determine that the first voltage level exceeds the nominal voltage level by a first margin, wherein the first margin reflects an upper bound to noise associated with the nominal voltage level, and
apply the first voltage level to the second circuit element.

18. The computing device of claim 17, wherein the control element is further configured to:
determine that first circuit element has begun to operate at a second voltage level instead of operating at the first voltage level;
determine that the second voltage level is less than the sum of the nominal voltage level and the first margin and greater than the difference of the nominal voltage level and a second margin, wherein the second margin reflects a lower bound to noise associated with the nominal voltage level;

determine that performance is prioritized over power savings relative to the second circuit element; and apply the second voltage level to the second circuit element.

19. The computing device of claim 17, wherein the control element is further configured to:

determine that first circuit element has begun to operate at a second voltage level instead of operating at the first voltage level;

determine that the second voltage level is less than the sum of the nominal voltage level and the first margin and greater than the difference of the nominal voltage level and a second margin, wherein the second margin reflects a lower bound to noise associated with the nominal voltage level;

determine that power savings is prioritized over performance relative to the second circuit element; and apply the nominal voltage level to the second circuit element.

20. The computing device of claim 17, wherein the control element is further configured to:

determine that first circuit element has begun to operate at a second voltage level instead of operating at the first voltage level;

determine that the second voltage level is less than difference of the nominal voltage level and a second margin, wherein the second margin reflects a lower bound to noise associated with the nominal voltage level; and apply the nominal voltage level to the second circuit element.

* * * * *